United States Patent [19]

Katagiri

[11] Patent Number: 5,086,729
[45] Date of Patent: Feb. 11, 1992

[54] VACUUM PROCESSING APPARATUS AND TRANSPORTATION SYSTEM THEREOF

[75] Inventor: Yoshitaka Katagiri, Yokohama, Japan

[73] Assignee: Asahi Glass Company Ltd., Tokyo, Japan

[21] Appl. No.: 365,677

[22] Filed: Jun. 13, 1989

[30] Foreign Application Priority Data

Jun. 13, 1988 [JP] Japan ............... 63-143685
Jun. 13, 1988 [JP] Japan ............... 63-143686

[51] Int. Cl.⁵ .................. B05C 3/09; B60L 13/04; B60L 13/10
[52] U.S. Cl. ............................. 118.729; 118/50; 118/500; 198/619; 318/135; 414/217
[58] Field of Search ............ 198/619; 104/282, 283, 104/284, 290, 293, 292, 134; 414/217, 347, 340, 337, 338; 318/135; 118/50, 729, 500

[56] References Cited

U.S. PATENT DOCUMENTS

| | | | |
|---|---|---|---|
| 3,845,720 | 11/1974 | Bohn et al. | 104/283 |
| 3,863,574 | 2/1975 | Thomas | 318/135 |
| 3,895,585 | 7/1975 | Schwarzler | 318/135 |
| 3,899,979 | 8/1975 | Godsey | 104/283 |
| 4,392,435 | 7/1983 | Moody et al. | 198/619 |
| 4,540,326 | 9/1985 | Southnorth et al. | 198/619 |
| 4,576,828 | 3/1986 | Walker | 198/619 |
| 4,619,573 | 10/1986 | Rathman et al. | 198/619 |
| 4,624,617 | 11/1986 | Belna | 414/347 |
| 4,664,578 | 5/1987 | Kakehi | 414/217 |
| 4,686,435 | 8/1987 | Heidelberg et al. | 318/135 |
| 4,690,066 | 9/1987 | Morishita et al. | 104/284 |
| 4,766,993 | 8/1988 | Kita et al. | 198/619 |
| 4,817,533 | 4/1989 | Azukizawa et al. | 104/290 |
| 4,825,773 | 5/1989 | Morishita et al. | 318/135 |
| 4,877,123 | 10/1989 | Fukuwatari et al. | 198/619 |

FOREIGN PATENT DOCUMENTS

| | | | |
|---|---|---|---|
| 0169983 | 2/1986 | European Pat. Off. | |
| 0052149 | 3/1982 | Japan | 198/619 |
| 1240647 | 10/1986 | Japan | 198/619 |
| 2165515 | 4/1986 | United Kingdom | 198/619 |

*Primary Examiner*—Willard E. Hoag
*Attorney, Agent, or Firm*—Oblon, Spivak, McClelland, Maier & Neustadt

[57] ABSTRACT

A vacuum processing apparatus comprises a carrying body for holding a glass plate thereon, a pair of elongated stationary members extended in a vacuum chamber in which processing stages for forming films on the glass plate by a vapor deposition method are provided, a linear motor transportation device provided at one of the stationary members, and a pair of movable members provided at both sides of the carrying body so that the movable members are moved along the stationary members in a non-contacting state by the action of the linear motor device.

14 Claims, 11 Drawing Sheets

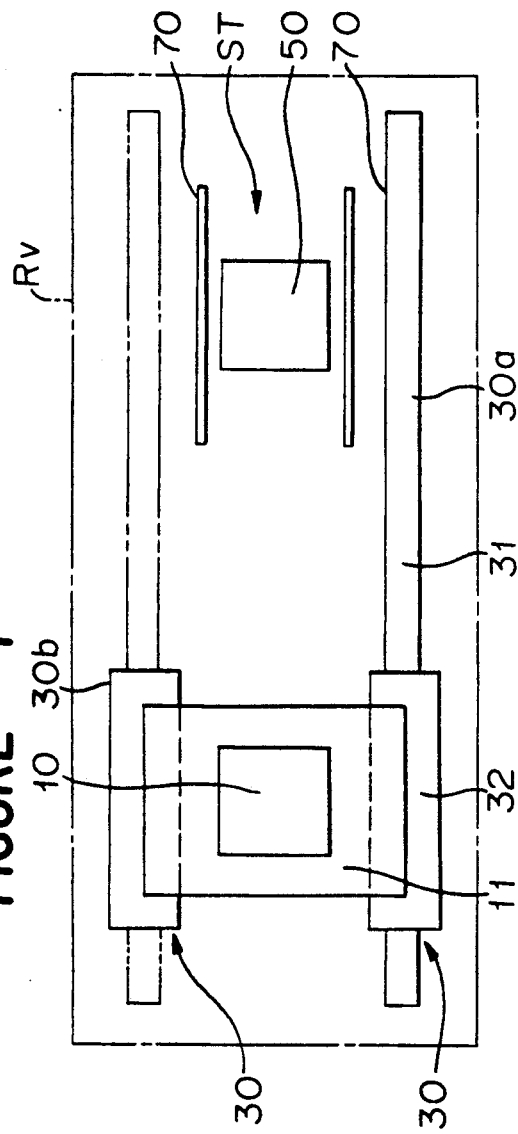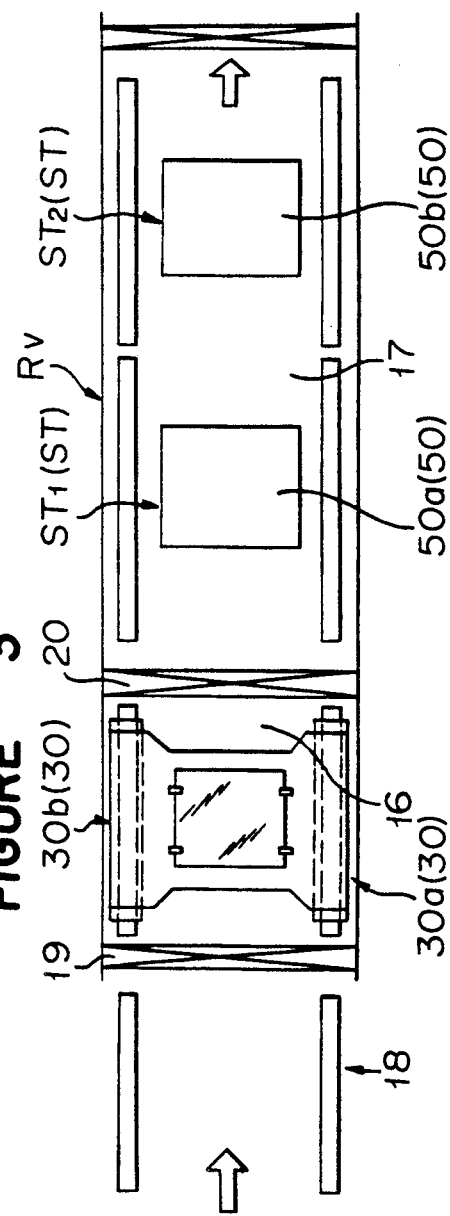

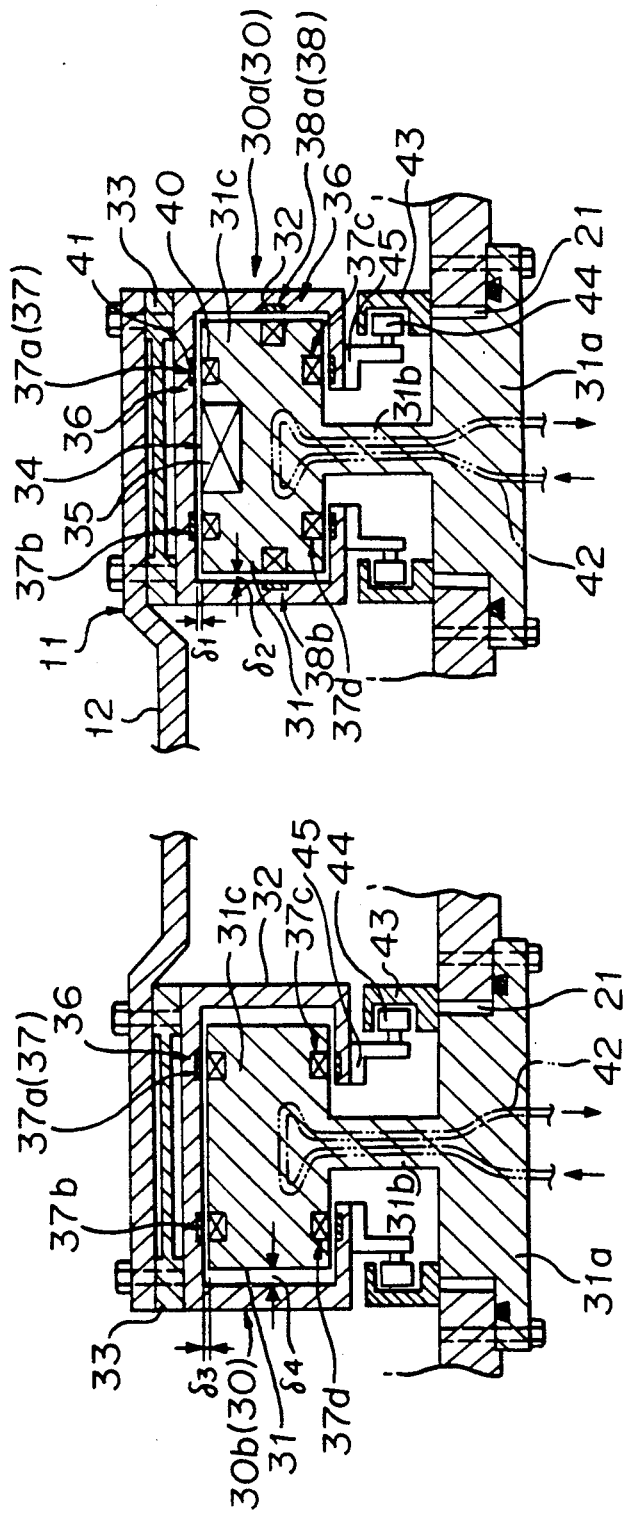

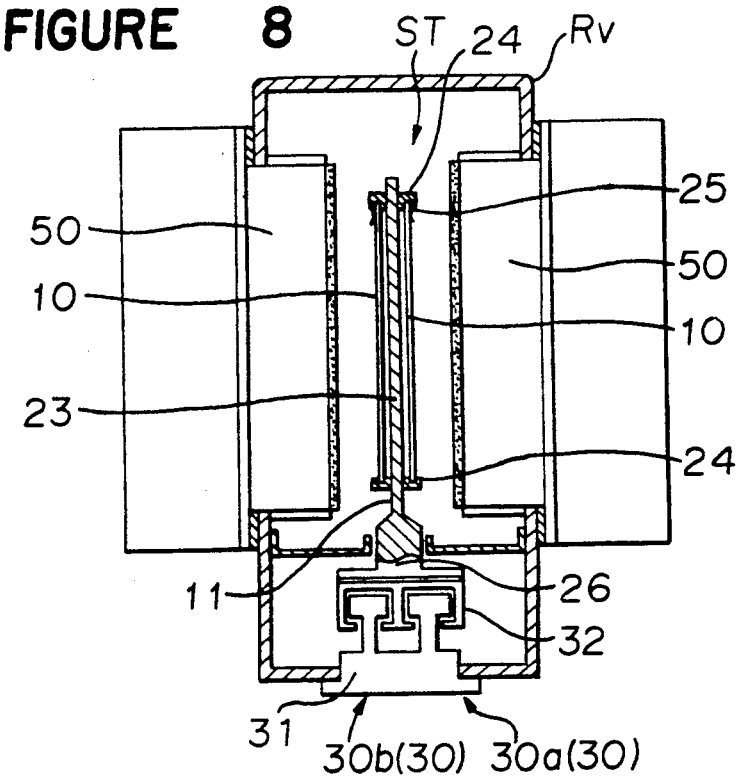
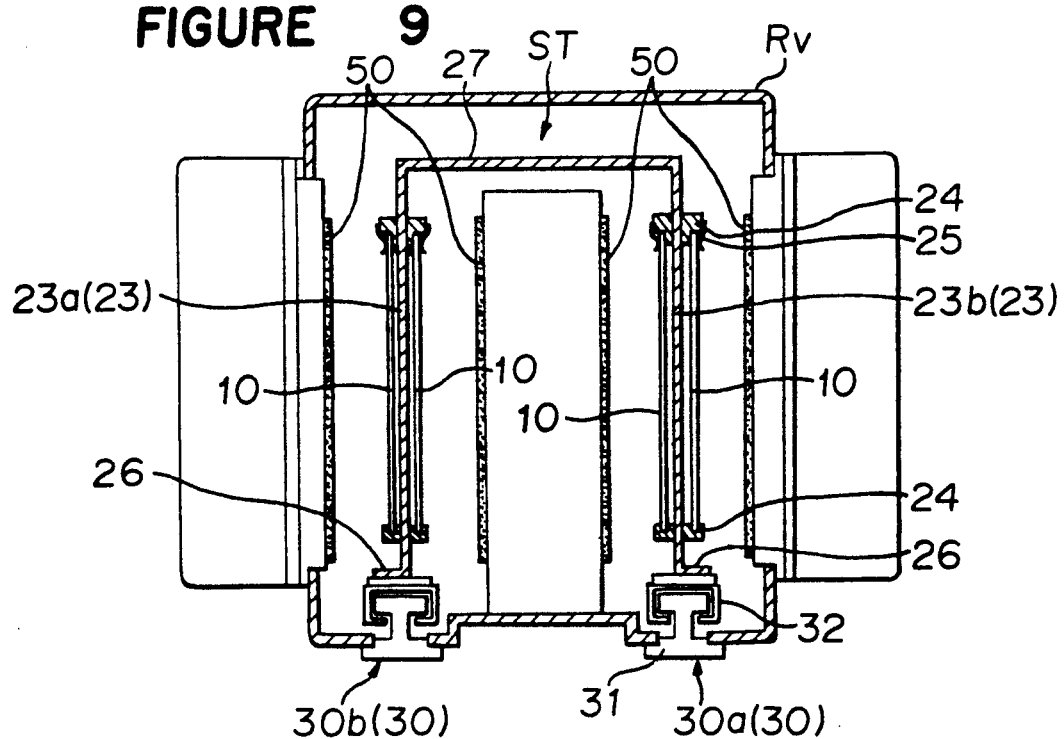

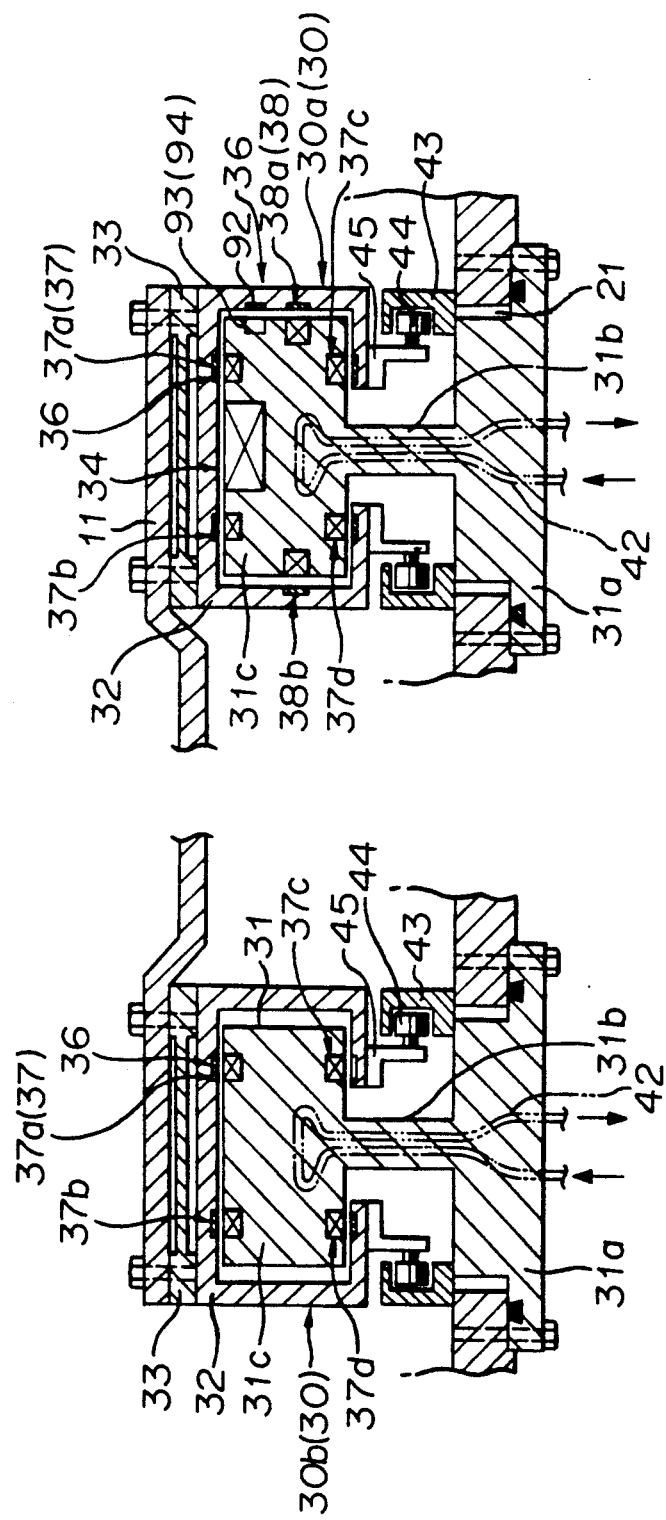

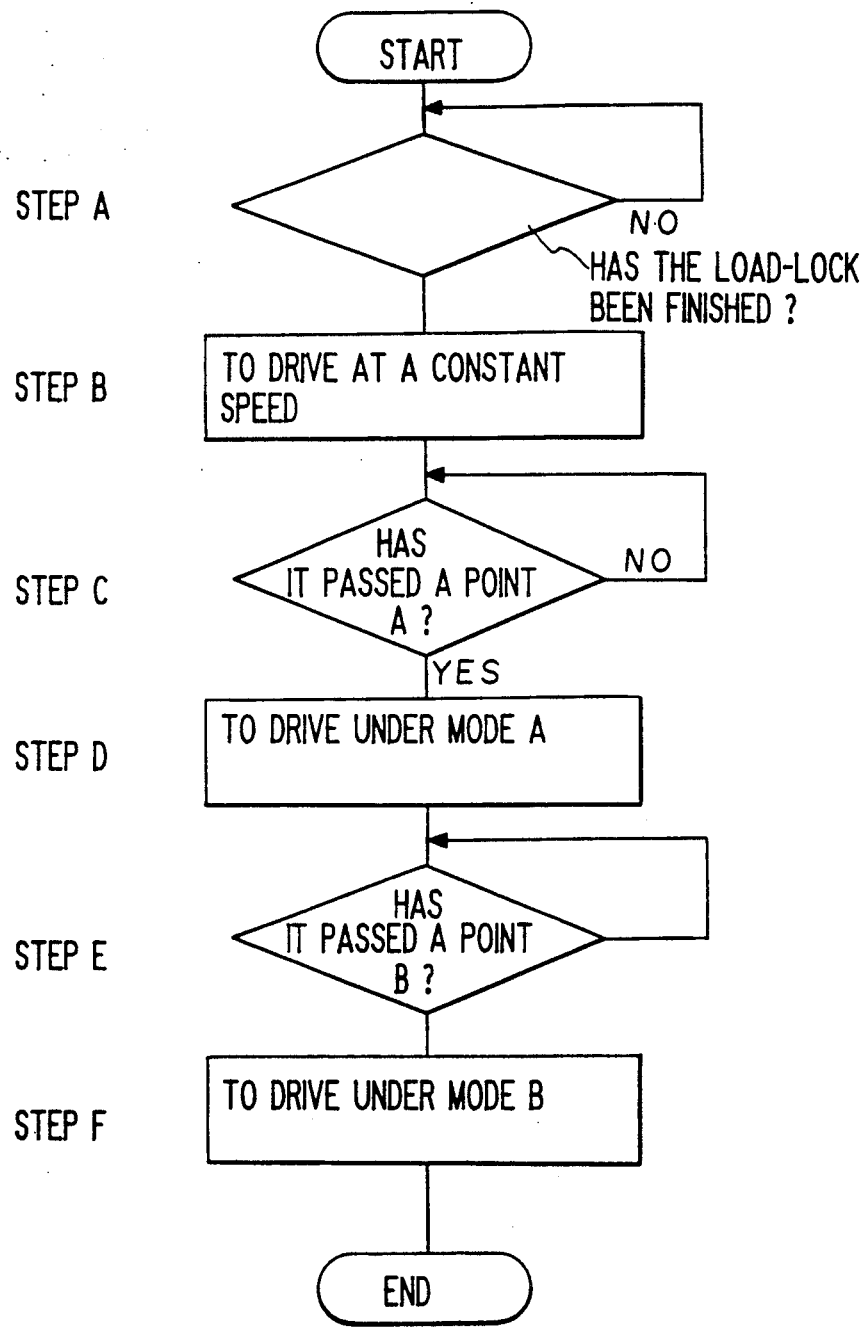

VACUUM PROCESSING APPARATUS AND TRANSPORTATION SYSTEM THEREOF

BACKGROUND OF THE INVENTION

1. Field of the Invention

The present invention relates to a transportation system which transports a material to be processed in the vacuum processing apparatus and a vacuum processing apparatus adapted to transport a material to be processed in a vacuum processing stage in a vacuum processing apparatus, where vacuum treatments such as heating, film forming, dry-etching and so on are carried out.

2. Description of the Related Art

As a vacuum film forming apparatus which is one of conventional vacuum processing apparatuses, there has been known one as shown in FIGS. 15 and 16. Namely, the vacuum film forming apparatus has a supporting means 2 for supporting a material to be processed 1 (hereinbelow, referred to simply as a substrate) such as a base plate and so on, transportation rollers 3 provided at both sides of the supporting means 2 to be driven by means of a chain, a pair of guide rails 4 placed in a vacuum processing apparatus Rv and cam followers 5 mounted on the supporting means 2 to exert a pressing force to drive the supporting means 2 downwardly, whereby the supporting means 2 is caused to move along the guide rails 4 by means of the transportation rollers 3 while the rising of the supporting means 2 is suppressed, and the substrate is subjected to a film forming treatment at a film forming position (not shown).

In such a vacuum film forming apparatus, since the cam followers 5 to prevent the supporting means 2 from rising are used, a surface pressure exerted between the transportation rollers 3 and the guide rails 4 is fairly high. Further, a lubricant can not be applied between them in consideration of adverse effect to the film forming treatment due to the evaporation of the lubricant in the vacuum processing apparatus. Accordingly, when the supporting means 2 is moved, dust D such as metallic powder caused by the friction between the transportation rollers 3 and the guide rails 4 flies, and the dust D possibly deposits on a portion where the film forming treatment is to be carried out to the substrate 1. On account of this, there arise problems that the thickness of the film on the substrate 1 is uneven, and pin holes are resulted in the film to thereby deteriorate the quality of final products.

The above-mentioned problems arise not only in the vacuum film forming apparatus, but also in all kinds of vacuum processing apparatuses.

SUMMARY OF THE INVENTION

It is an object of the present invention to provide a transportation system for a vacuum processing apparatus and a vacuum processing apparatus having the transportation system which can avoid the adverse effect of dust to a vacuum processing treatment while maintaining security in the system and apparatus as well as stable transportation of a substrate to be processed.

In accordance with the present invention, there is provided a transportation system for a vacuum processing apparatus which comprises a supporting means for supporting a substrate to be processed and a pair of transportation means for supporting and transporting said supporting means in a vacuum processing apparatus wherein at least one of said transportation means is a magnetically floating type linear motor transportation means comprising a stationary member and a movable member movable to said stationary member in a non contacting state.

In accordance with the present invention, there is provided a vacuum processing apparatus which comprises:

a supporting means for supporting a substrate to be processed, a vacuum transportation means comprising a pair of transportation means for supporting and transporting said supporting means in a vacuum processing apparatus, either of said transportation means being constituted by a magnetically floating type linear motor transportation means which comprises a stationary member and a movable member movable to said stationary member in a noncontacting state, a vacuum processing means for vacuum-processing said substrate placed at a processing stage in said vacuum processing apparatus, and a shielding member for shielding said vacuum transportation means and said vacuum processing means at a position correspondings to said processing stage.

BRIEF DESCRIPTION OF THE DRAWINGS

In the drawings:

FIG. 1 is a diagram showing schematically a transportation system and a vacuum processing apparatus having such transportation system according to the present invention;

FIG. 3 is a plan view of the transportation system and the vacuum processing apparatus;

FIGS. 4 and 5 are respectively cross-sectional views taken along lines IV—IV and V—V in FIG. 2;

FIGS. 7 to 9 are respectively a perspective view and cross-sectional views showing important parts of the second, third and fourth embodiments of the transportation system and the vacuum processing apparatus having the transportation system according to the present invention;

FIG. 11 is a cross-sectional view taken along a line XI—XI in FIG. 10;

FIG. 12 is a flow chart showing operational steps of a speed controlling section in the fifth embodiment;

DESCRIPTION OF THE PREFERRED EMBODIMENTS

Figure 2:
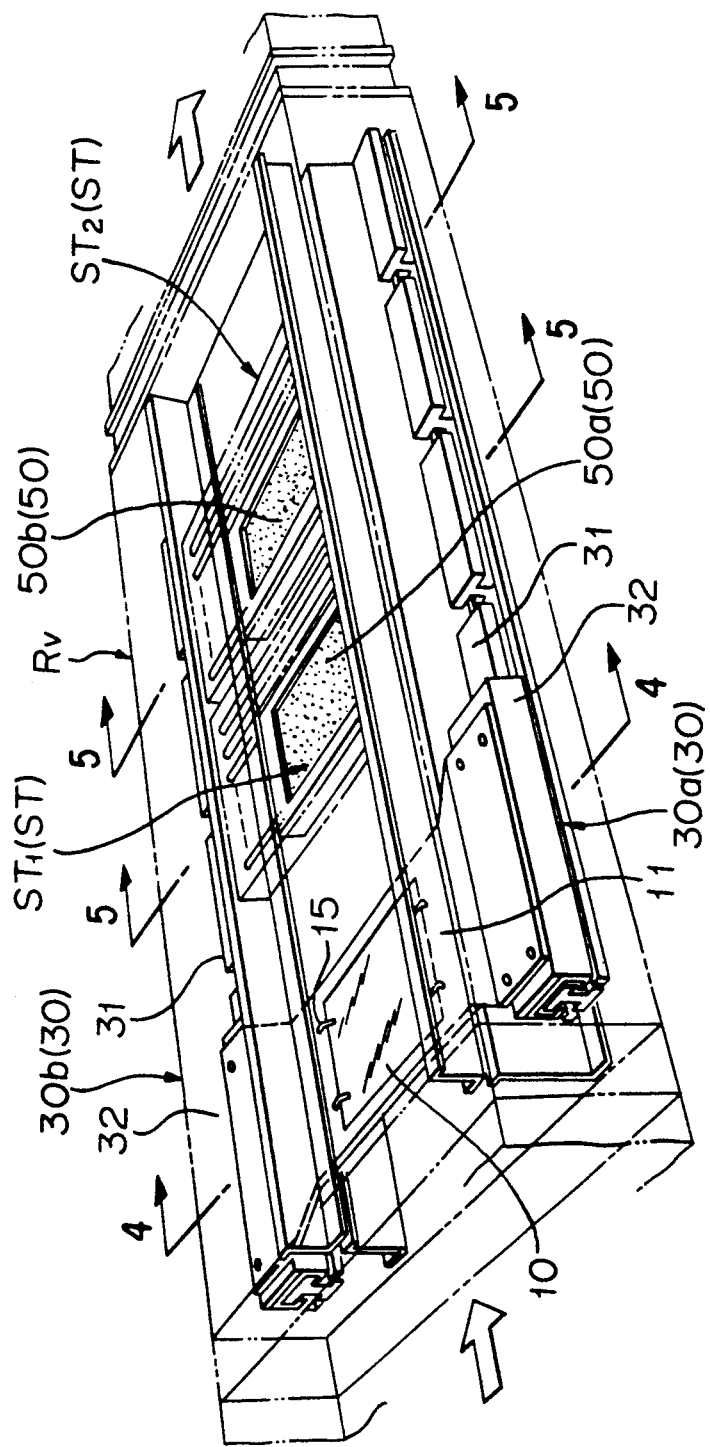
FIG. 2 is a perspective view of a first embodiment of the transportation system and the vacuum processing apparatus having the transportation system according to the present invention.

Preferred embodiments of the transportation system and the vacuum processing apparatus having the transportation system according to the present invention will be described in more detail in reference to the drawings.

In the present invention, the substrate 10 to be processed can be a base plate or film for display or various kinds of base plates or film used for the base for semiconductor devices as far as they are to be subjected to a vacuum treatment.

The supporting means 11 can be of any shape such as a plate-like shape or other suitable shape and a change of design may be made as far as the substrate 10 can be subjected to a treatment by the processing means 50 and the supporting means 11 has a supporting member for supporting the substrate. The number of the supporting members for the supporting means 11 may be a single or plural. The substrate 10 may be placed horizontally, vertically, or with an angle.

A pair of transportation means 30a, 30b of the vacuum transportation means 30 may be arranged approaching to or spacing apart from each other as far as the supporting means 11 can be moved safely. When a magnetically floating type linear motor transportation means is used for either of the pair of transportation means 30a, 30b, it is necessary that such linear motor transportation means has a stationary member 31 and a movable member 32 movable to the stationary member 31 in a non-contacting state wherein a driving force generating section and a rising position controlling section are provided between the stationary and movable members. In this case, although the stationary member 31 may be formed integrally with the linear motor transportation means, it is desirable that a plurality of the stationary members having a suitable length constitute unit pieces, and are arranged in each block from the viewpoint that a suitable number of stationary members 31 can be arranged depending on a transportation means having a requisite length.

A driving force generating section may be changed in design in such a manner that each magnetically exciting part is formed by mounting a coil on a magnetic substance at the side of the stationary member 31 or the movable member 32, and each non-magnetic conductive piece (including the stationary member 31 or the movable member 32 itself) is placed opposing the magnetically exciting parts, whereby they are magnetically excited in a sequential manner.

A rising position controlling section may be of any type as far as it utilizes the attractive or the repulsive action of a permanent magnet or a solenoid or it controls gaps formed between the stationary and movable members in the vertical and width directions. It is, however, preferable to use the solenoid as the magnetically exciting part for controlling rising position and to utilize the attractive action in view of easiness of controlling the rising position.

In designing the magnetically floating type linear motor transportation means, it is preferable that the magnetically exciting parts for exerting a driving force and the magnetically exciting parts for controlling the rising position are provided at the side of the stationary member 31 because it is easy to carry out wiring operations. Auxiliary rollers may be attached to the movable member 32 for assisting the movement of it in consideration of the necessity of moving the movable member in a non-rising state when maintenance is to be carried out.

As to controlling of the movement of the vacuum transportation means 30, it may usually be moved at a constant speed, or may be once stopped at a processing stage ST. Speed control may be conducted to make a degree of treatment equal when a distribution of treating speed of the processing means 50 at the processing stage ST is considered. The pair of transportation means 30a, 30b are so designed that the both means respectively have the function of transporting the supporting means 11. It is, however, preferable that only one of the pair of magnetically floating type linear motor transportation means has such function because the supporting means 11 can not be transported in a stable manner if there is unbalance between the transporting function of the pair of transportation means 30a, 30b.

In a case that the supporting means 11 is provided with a horizontal base portion, and the processing means 50 includes a heating section, and if an amount of thermal deformation in the horizontal base portion is relatively large, a deformation absorbing means may be provided in one of the transportation means 30a, 30b from the viewpoint of assuring stable transportation of the supporting means 11.

As the processing means 50, a PVD (Physical Vapor Deposition) device utilizing a physical technique, such as a vacuum sputtering device, a vacuum vapor deposition device, a CVD (Chemical Vapor Deposition) device utilizing a chemical technique, such as a plazma CVD device, a vacuum heating device, a dry etching device or another type of device may be used as far as a vacuum processing operation is available. The number of the processing means 50 and the combination thereof may be selected depending on conditions of vacuum processing applied to the substrate 10 to be processed.

As a shielding member 70, any material may be used unless it does not cause a trouble to the function of transporting the vacuum transportation means 30 on the basis of the operational characteristics of the processing means 50, and it can shield heat, a magnetic flux or a film forming material scattered thereto.

In accordance with the present invention, the substrate 10 to be processed on the supporting means 11 is moved to the processing stage ST by means of the vacuum transportation means 30 in the vacuum processing apparatus Rv, and predetermined processing is conducted to the substrate 10 by the processing means 50 at the processing stage ST. In this case, the paired transportation means 30a, 30b of the vacuum transportation means 30 support the supporting means 11 at its both sides in a stable manner, wherein at least one transporting means 30a is constituted by the magnetically floating type linear motor transportation system which moves the supporting member of the supporting means 11 in a non-contacting state.

In processing operations to the substrate 10 to be processed by the processing means 50, the shielding member 70 blocks heat, a magnetic flux and a film forming material even though such undesired objects are produced from the processing means 50, and they do not reach the vacuum transportation means 30.

Several examples of the transportation system for a vacuum processing apparatus and the vacuum processing apparatus having a transportation system of the present invention will be described in detail.

EXAMPLE 1

FIGS. 2 to 5 show a vacuum film forming apparatus to which the present invention is applied.

The vacuum film forming apparatus is for manufacturing a base plate for display in which a protective film of $SiO_2$ and a transparent conductive film of ITO (indium tinn oxide) are sequentially deposited on glass base plate by a sputtering method. A predetermined display pattern is formed on the base plate for display by etching at a subsequent step.

In the basic construction, the vacuum processing apparatus comprises the supporting means 11 for holding the glass plate 10 as a substrate to be processed, the vacuum transportation means 30 (specifically, 30a and 30b) for transporting the supporting means 11 in the vacuum processing apparatus Rv, the first and second sputtering devices 50 which are respectively placed in the first and second processing stages ST1, ST2 in the vacuum processing apparatus Rv to form the films of $SiO_2$ and ITO on the glass plate 10 by sputtering, and the shielding members 70 for shielding the spaces between the sputtering devices 50 and the vacuum transportation means 30.

Figure 5:
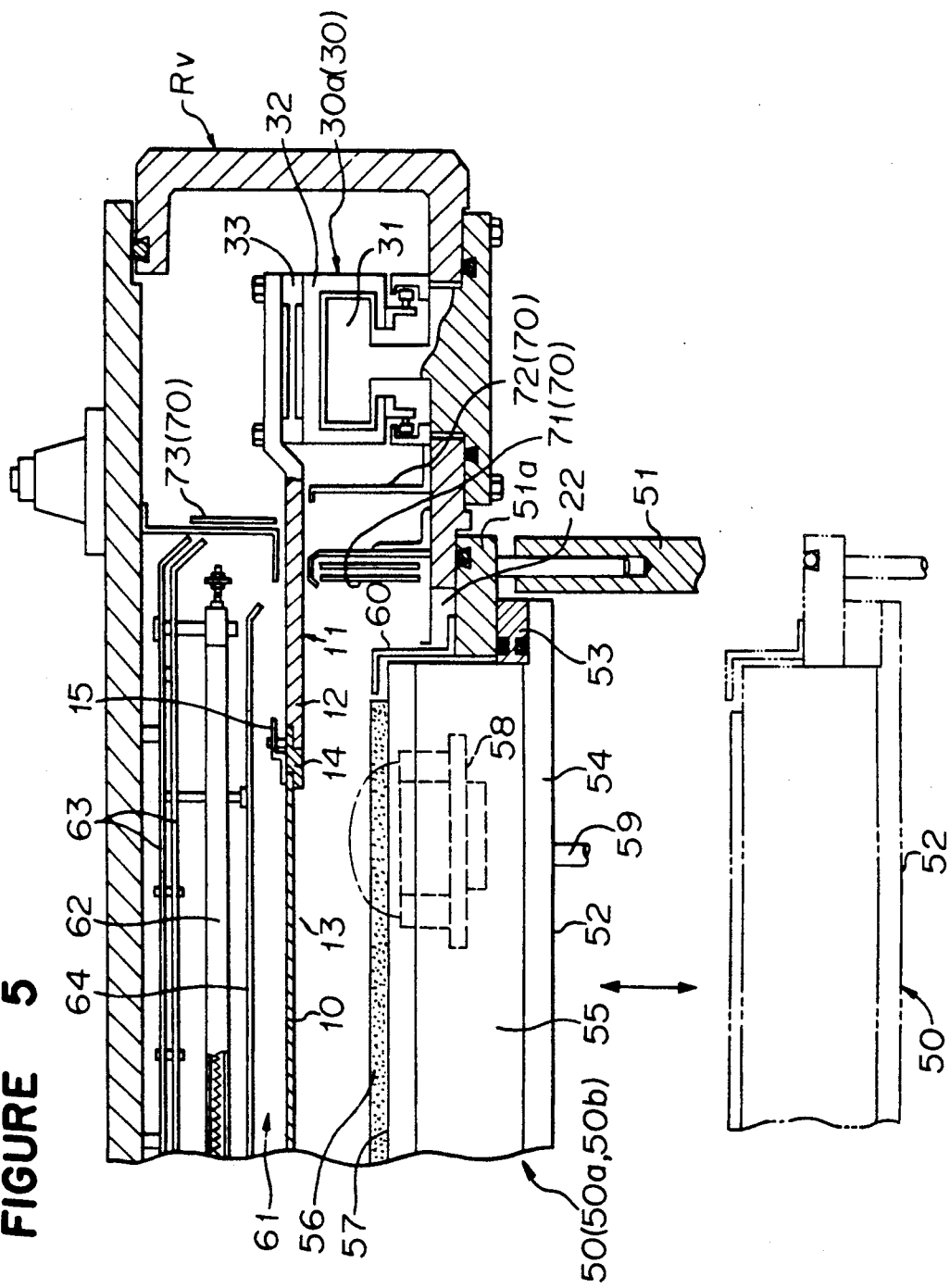

In this embodiment, the supporting means 11 has a flat-plate like horizontal base portion 12 extending in the horizontal direction as shown in FIGS. 2 and 5. An opening 13 is formed at substantially the central portion of the horizontal base portion 12. A receiving member 14 is provided at the circumferential edge of the aperture 13 to support the glass plate 10. A plurality of, for instance, four clamp members 15 are provided in the vicinity of the receiving member 14, whereby the circumferential edge of the glass plate 10 supported by the receiving member 14 is clamped by the clamp members 15.

As shown in FIG. 3, the vacuum processing apparatus Rv is functionally divided into two parts: a load-lock chamber 16 in which the glass plate 10 is supported on the supporting means 11 and a processing chamber 17 in which vapor deposition by sputtering is carried out at the two processing stages ST1, ST2. A waiting zone 18 for drawing out the supporting means at the time of maintenance is provided before the load-lock chamber 16. The vacuum transportation means 30 is extended into the waiting zone 18. Switching valves 19, 20 are respectively provided to isolate in an air-tight manner the load-lock chamber 16, the processing chamber 17 and the waiting zone 18 respectively.

The vacuum transportation means 30 comprises the pair of magnetically floating type linear motor transportation means 30a, 30b which are controlled by a transportation controlling unit (not shown). The linear motor transportation means 30a, 30b support both side portions of the horizontal base portion 12 of the supporting means 11. Each of the linear motor transportation means 30 is divided into a suitable number of blocks, and each block has a stationary member 31 made of a non-magnetic material (in this embodiment, an austenite seriese stainless steel is used) which is arranged to close a fitting aperture 21 formed in the bottom wall of the vacuum processing apparatus Rv and a movable member 32 made of a non-magnetic conductive material (in this embodiment, aluminum is used) which is losely fitted to the stationary member 31. The stationary member 31 comprises a stationary base portion 31a fixed to the outer edge portion of the fitting aperture in the bottom wall of the vacuum processing apparatus Rv, a stationary body portion 31b extending along the longitudinal direction of the central portion of the stationary base portion 31a and a stationary head portion 31c provided at the upper end of the stationary body portion 31b and having a width larger than that of the stationary body portion 31b. The movable member 32 is formed to have a rectangular shape in cross section with an opening at its one side so that it surrounds the upper surface, one side surface and the lower surface of the stationary head portion 31c. The movable member 32 is fixed to both side portions of the horizontal base portion 12 of the supporting means 11 by means of an insulating plate 33 made of a material such as alumina.

The linear motor transportation means 30a as one of the paired vacuum transportation means 30 has a driving force generating section 34 and a rising position controlling section 36. The driving force generating section 34 is constituted by a magnetically exciting part for driving which is placed in a recess formed at the central portion of the stationary head portion 31c and a conductive part (in this embodiment, these being constituted by the movable member 32 itself) which opposes the magnetically exciting part 35. The magnetically exciting part 35 comprises an excitation coil having a suitable number of turns which is wound on a flat magnetic plate having teeth formed at a predetermined pitch, for instance. By producing a magnetic field passing in the conductive part, a predetermined intensity of an eddy current is induced in the conductive part to thereby generate a driving force to move the movable member 32 along the stationary head portion 31c.

The rising position controlling section 36 comprises four vertical position controlling members 37, (specifically 37a to 37d) which are respectively provided between the movable member 32 and both sides in the width direction of the upper surface of the stationary head portion 31c and between the movable member 32 and both sides in the width direction of the lower surface of the stationary head portion 31c, and a pair of horizontal position controlling members 38 (specifically 38a, 38b) which is provided between the movable member 32 and both side surfaces of the stationary head portion 31c. Each of the rising position controlling sections 36 is constituted by electromagnets 40 as position determining exciting parts provided in recesses in the stationary head portion 31c and magnetic plates 41 placed opposing the electromagnets 40 so that attractive magnetic fields are formed between the electromagnets 40 and the magnetic plates 41 when the electromagnets 40 are excited. And they are so determined that the gap $\delta1$ in the vertical direction and the gap $\delta2$ in the horizontal direction between the stationary head portion 31c and the movable member 32 are respectively in a range of about 1 mm-3 mm when the rising position controlling sections 36 are in operation.

The other linear motor transportation means 30b has only the rising position controlling section 36 which comprises vertical position controlling member 37 (specifically 37a to 37d) having the same construction as those in the linear motor transportation means 30a and has no horizontal position controlling member. It is so determined that the gap $\delta3$ in the vertical direction between the stationary head portion 31c and the movable member 32 is in a range of about 1 mm–3 mm when the rising position controlling sections 36 is in operation, but the gap 84 in the horizontal direction between the stationary head portion 31c and the movable member 32 is in a range about 5 mm–10 mm so that the thermal deformation of the supporting means 11 can be absorbed.

In FIG. 4, a reference numeral 42 designates a cooling duct which is assembled in the stationary member 31 of each of the linear motor transportation means 31a, 31b to supply cooling water, a numeral 43 designates auxiliary guide rails extending along both sides of the stationary member 31 and numerals 44 designate auxiliary rollers attached to side portions of the lower surface of the movable member 32 by means of brackets 45 so as to assist the movable member 32 to move along the auxiliary guide rails 43 when the movable member 32 is in a nonrising state.

As shown in FIGS. 2 and 5, the sputtering device 50 is supported by an up/down rod 51 in a vertically movable manner at each opening 12 formed in the bottom wall of the vacuum processing apparatus Rv, the opening being in correspondense to the lower portion of each of the processing stages ST. When the sputtering device 50 is brought to a set position, the aperture 22 in the bottom wall is completely closed.

The sputtering device 50 has a cathod electrode 52 supported by the up/down rod 51. The cathod electrode 52 is provided with a base plate 54 fixed to the upper fitting part 51a of the up/down rod 51 through an insulating sealing member 53 and a cathod main body 55 of a box shape in cross section, which is placed on the base plate 54 wherein the top surface of the cathod main body 55 constitutes a surface which is in contact with a target material 56 (in this embodiment, a plate material of $SiO_2$ is used at the processing stage ST1 and a plate material of ITO is used at the processing stage ST2), and the target material 56 is supported on the contacting surface 57 by means of holders (not shown).

In this embodiment, a magnetic scanning means is installed in the cathod main body 55 so as to form a magnetic field as indicated by one dotted chain line between the target material 56 and the glass plate 10. In FIG. 5, a reference numeral 59 designates a cooling duct for supplying cooling water in the cathod main body 55 and a numeral 60 designates an earth shield which causes concentrated electric discharges on the surface of the target material 56.

A heater unit 61 is arranged in the upper portion of each of the processing stages ST to heat the glass plate 10 to an ambient temperature (such as 300° C.–400° C.) which is necessary to carry out vapor deposition by sputtering. In this embodiment, the heater unit 61 is constituted by a large number of regularly arranged rod-like heaters 62, a reflector 63 disposed above the heaters 62 to reflect heat from the heaters 62 to the downward direction and a heat transfer plate 64 disposed below the rod-like heaters 62 to deflect heat from the heaters 62 in the downward direction.

In this embodiment, the shielding member 70 comprises a pair of heat-insulating, non sticky plates 71, magnetic shielding plates 72 and a pair of heat-insulating plates 73, wherein the heat-insulating, non-sticky plates 71 are placed in the lower region of the supporting means 11 as the boundary to shield the moving zone of the supporting means which includes the linear motor transportation means 30a, 30b and processing stages ST, and which have a reflecting surface facing the moving zone of the supporting means; the magnetic shielding plates 72 are disposed at the outer side of the heat-insulating, non-sticky plates 71 so as to oppose the other magnetic shielding plates 72 in a parallel relation, and the heat-insulating plates 73 are placed in the upper region of the supporting means 11 as the boundary to shield the moving zone of the supporting means which includes the linear motor transportation means 30a, 30b and processing stages ST, and which have a reflecting surface facing the moving zone of the supporting means 11.

The operation of the transportation system and the vacuum processing apparatus of the above-mentioned embodiment of the present invention will be described.

FIGS. 2 and 3, a robot (not shown) determines the position of the glass plate 10 on the receiving member 14 of the supporting means 11 in the load-lock chamber 16. Then, the glass plate 10 is clamped by the clamp members 15. When the clamping operation has been finished, a starting signal is supplied to a transportation controlling unit (not shown), which actuates the driving force generating section 34 and the rising position controlling section 36 of the linear motor transportation means 30a, 30b.

Then, the movable member 32 of the linear motor transportation means 30a is raised from the stationary member 31 and is moved by a predetermined driving force. In this case, the movable member 32 of the other linear motor transportation means 30b is not driven. However, the movable member 32 of the other linear motor transportation means 30b is moved by following the former movable member 32 of the linear motor transportation means 30a by means of the supporting means 11 because the later movable member 32 is raised from the stationary member 31. Since the position of each of the movable members 32 in a raised state is controlled by the action of the raised position controlling section 36, the movement with fluctuation in the vertical and horizontal directions of the movable members 32 can be avoided. Accordingly, the supporting means 11 can be moved to the processing stage ST1 in a non-contacting state while a stable posture can be maintained.

Figure 6A:
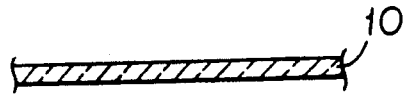
FIG. 6 is a diagram showing processing steps in the vacuum processing apparatus according to the first embodiment of the present invention.
Figure 6B:
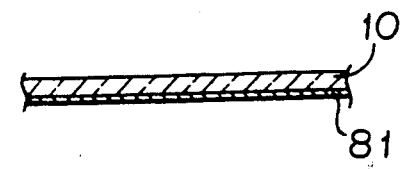

When the supporting means 11 enters into the first processing stage ST1, the first sputtering device 50a and the heater unit 61 corresponding to the device are actuated. Then, the target material 56 is brought to contact with the lower surface of the glass plate 10 through the aperture 13 of the supporting means 11, and a film 81 of $SiO_2$ is vapor-deposited by sputtering on the lower surface of the glass plate 10, as shown in FIGS. 6a and 6b.

In this case, thermal expansion is caused in the horizontal base portion 12 of the supporting means 11 when the heater unit 61 heats the glass plate 10. However, since a relatively large gap 84 is formed in the width direction between the stationary member 31 and the movable member 32 of the linear motor transportation means 30b, a component of expansion resulted by the thermal expansion is absorbed by the gap 84 and the transportation of the supporting means 11 can easily be done.

When the sputtering device 50a is actuated, heat is emitted from the cathod electrode 52 and ionized particles of the film forming material scatter from the target material 56. However, since the emitted heat and the scattered particles hit the heat-insulating, nonsticky plates 71, they do not reach the linear motor transportation means 30a, 30b.

In this embodiment, the magnetic scanning means 58 produces a magnetic field which necessarily influences other structural elements when the sputtering device 50a is operated. The magnetic field is, however, separated by means of the magnetic shielding plates 72 so that there is substantially no risk of erroneous operations of the linear motor transportation means 30a, 30b by the magnetic field. Heat generated from the heater unit 61 is also interrupted by the heat-insulating plates 73, and there is also substantially no risk of causing adverse effect to the linear motor transportation means 30a, 30b.

Figure 6C:
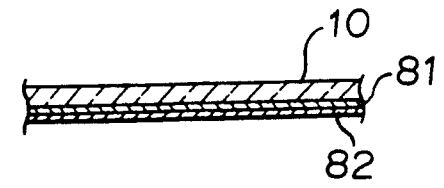

On completion of the processing at the first processing stage ST1, the supporting means enters into the second processing stage ST2, and the second sputtering device 50b and the heater unit 61 corresponding thereto are actuated. Then, the target material 56 is brought to contact with the film 81 on the glass plate 10 through the aperture 13 formed in the supporting means 11, and then a transparent conductive film 82 of ITO is vapor-deposited by sputtering on the protective film 81 of the glass plate 10 as shown in FIG. 6c. Even at this moment, easiness of transporting the supporting means 11 is not impaired by heat in the same manner as the processing stage ST1, and further, the above-mentioned shielding effect can be obtained. Thus, the film forming process is completed and a final product of the base plate for display is obtainable.

EXAMPLE 2

Figure 7:
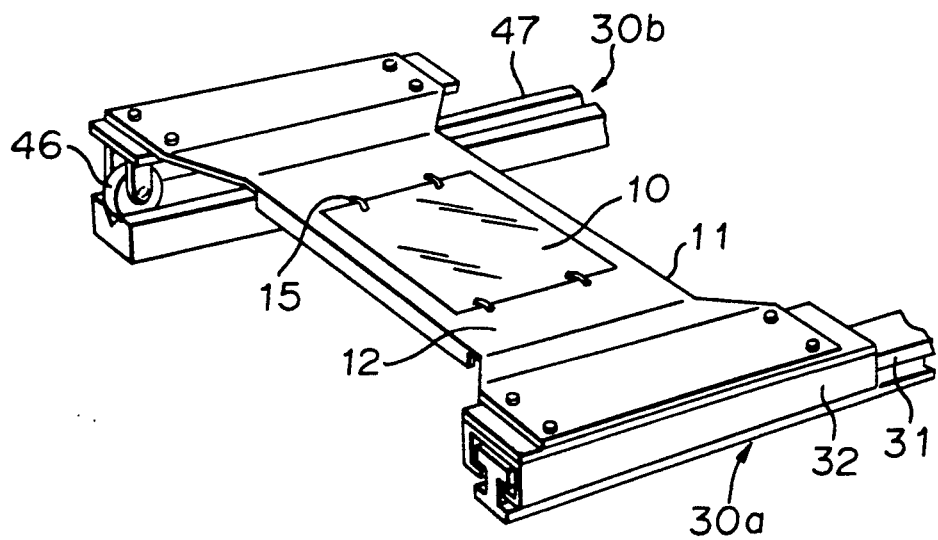

FIG. 7 shows another embodiment of the vacuum film forming apparatus having the same construction as Example 1 except that only one transportation means 30a is a magnetically floating type linear motor transportation means and the other transportation means 30b is provided with a transportation roller 46 at one side of the horizontal base portion 12 of the supporting means 11 so that the transportation roller 46 rolls along a guide rail 47. In the second embodiment, since one transportation means 30a is the magnetically floating type linear motor transportation means, the position of the movable member 32 to the stationary member 31 in a rising state can be certainly controlled. Accordingly, the transportation rollers 46 can be stably moved along the guide rail 47 without using a pressing means to push the transportation roller 46 by a cam follower, and the frictional resistance between the transportation roller 46 and the guide rail 47 can be minimized. Accordingly, production of dust such as metallic powder due to the sliding movement of the transportation roller 46 to the guide rail 47 can be effectively avoided.

In the second embodiment, the construction of the vacuum transportation means 30 can be simplified in comparison with that in Example 1.

EXAMPLE 3

FIG. 8 shows a third embodiment of the supporting means 11 for the vacuum film forming apparatus of the present invention. The supporting means 11, which is different from the above-mentioned embodiments 1 is provided with a vertical base portion 23 extending in the vertical direction, supporting members 24 provided at both side surfaces of the upper and lower portions of the vertical base portion 23 to support the glass plate 10 and clamp members 25 provided at the supporting members at the upper portion of the vertical base portion 23. A fitting base portion 26 is formed at the lower end of the vertical base portion 23. The basic construction of the vacuum transportation means 30 is similar to that in Example 1 except that the stationary member 31 and the movable member 32 of the paired linear motor transportation means 30a, 30b are respectively formed integrally therewith, and a fitting base portion 26 of the supporting means 11 is attached to the top portion of the integrally formed movable member 32.

In the third embodiment, a pair of the sputtering devices 50 are arranged as processing means at both sides of the vertical base portion 23 in one of the processing stages ST. Accordingly, the third embodiment provides the same function and effect as the first embodiment as in Example 1. Further, it is possible to perform sputtering to two glass plates 10 at the single processing stage, this permits the construction of a system suitable for a large scale production. Further, in the third embodiment, the pair of transportation means 30a, 30b are formed integrally. Accordingly, position aligning operations are unnecessary, and position determining operations for the vacuum transportation means 30 can be easy.

EXAMPLE 4

FIG. 9 is a cross-sectional view showing a fourth embodiment of the supporting means 11 for the vacuum film forming apparatus. The supporting means 11 comprises a pair of vertical base portions 23 (specifically 23a, 23b) whose upper ends are connected by a connecting member 27, supporting members 24 disposed at both sides of the upper and lower portions of each of the vertical portions 23 to support the glass plate 10, and clamp members 25 disposed at the upper supporting members 24. A fitting base portion 26 formed at the lower end of the vertical base portion 23 is firmly attached to the top portion of each of the movable members 32 of the pair of linear motor transportation means 30a, 30b of the vacuum transportation means 30. The sputtering devices 50 are disposed as processing means at both sides of each of the vertical base portions 23 in one processing stage ST.

In the fourth embodiment, since the vapor deposition by sputtering can be carried out to four glass plates 10 simultaneously at the single processing stage ST, a system suitable for a large scale production can be constructed. Further, the connecting member 27 can prevent the vertical base portion 23 from falling down. Accordingly, the glass plates 10 can be certainly held at correct posture when the vapor deposition by sputtering is carried out, whereby uneven vapor deposition caused by incorrect posture of the glass plates 10 can be avoided.

EXAMPLE 5

Figure 10:
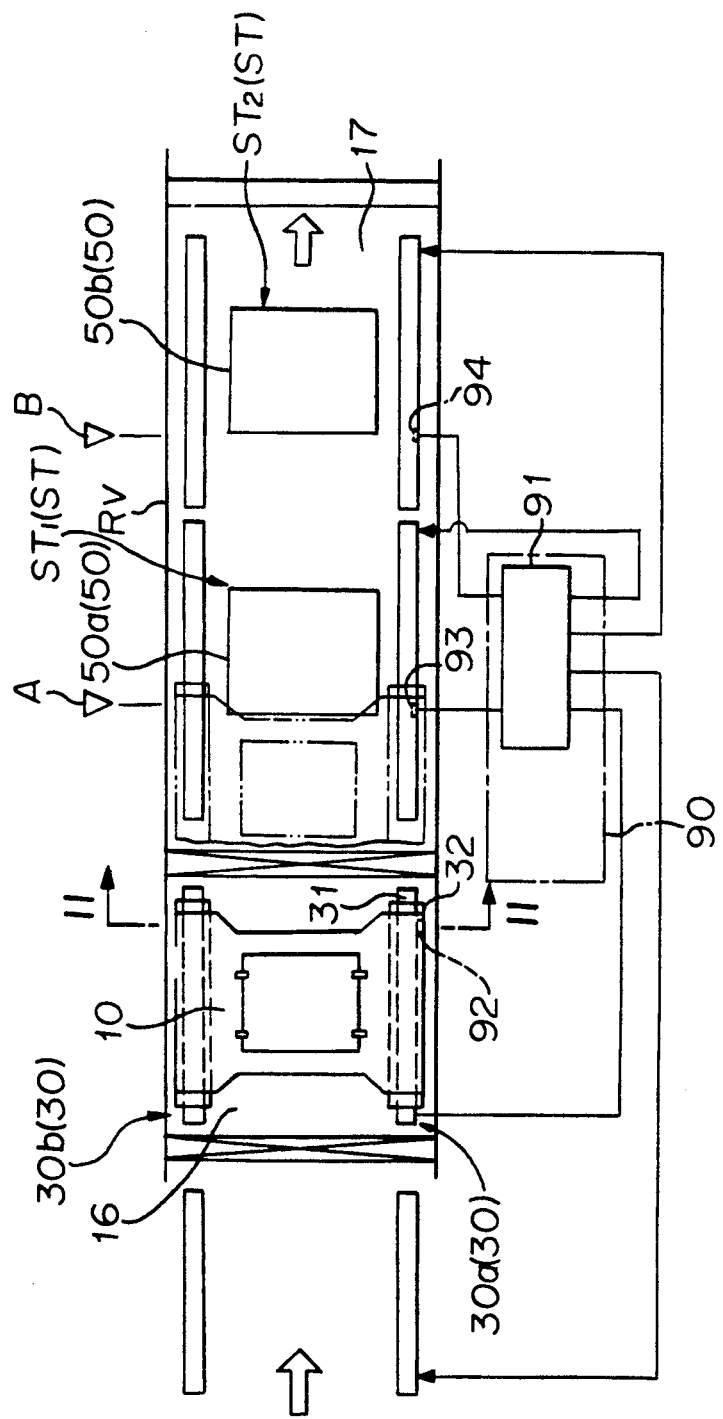
FIG. 10 is a plan view showing schematically the fifth embodiment of the vacuum processing apparatus according to the present invention.

FIG. 10 is a diagram showing a fifth embodiment of the vacuum film forming apparatus having the same basic construction as the first embodiment except that a speed controlling section 91 for adjusting the movement of the supporting means 11 is provided in a transportation controlling unit 90 for controlling the paired linear motor transportation means 30a, 30b. In the fifth embodiment, as shown in FIGS. 10 and 11, a magnetic plate 92 for detecting position is provided at a predetermined position inside the side portion of the movable member 32 of the one linear motor transportation means 30a, and eddy current type resolvers 93, 94 are installed at predetermined positions in a side surface of the stationary member 31 facing the magnetic plate 92. Specifically, in this embodiment, the resolvers 93, 94 are installed in the stationary member 31 at the positions which correspond to those just before the front edge of the glass plate 10 on the supporting means 11 respectively reach the first and second processing stages ST1, ST2 (the positions are indicated by the characters A and B in FIG. 10).

The speed controlling section 91 controls the speed of the supporting means on the basis of the positional information from the resolvers 93, 94 in accordance with a flow chart as shown in FIG. 12.

The controlling operations of the speed controlling section 91 will be described in detail in accordance with the flow chart of FIG. 12.

Figure 13A:
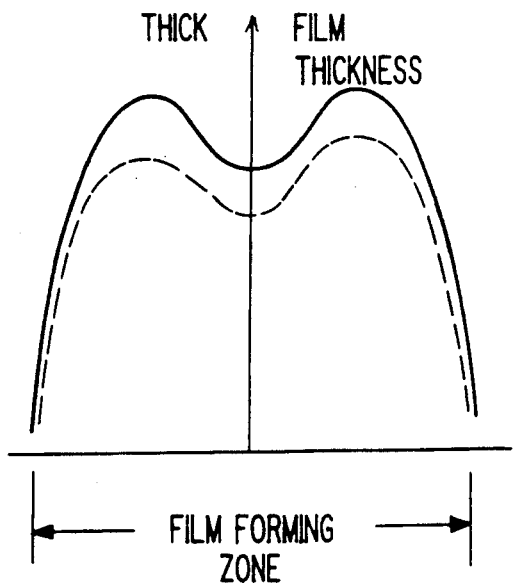
FIG. 13a is a diagram showing a distribution of film forming at the first and second film forming zones at the time of forwarding a supporting means at a constant speed in the fifth embodiment.
Figure 13B:
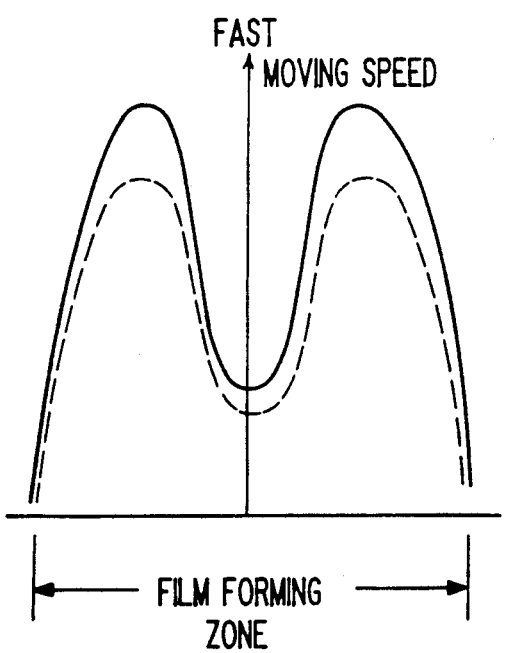
FIG. 13b is a diagram showing a distribution of speed for the supporting means at the first and second film forming zones.

First, the glass plate 10 is clamped on the supporting means 11 in the load-lock chamber 16. The speed controlling section 91 discriminates that the operation of load lock has been finished on the basis of a signal indicative of the completion of the clamping operations and moves the supporting means 11 at a constant speed (Steps a and b). When the magnetic plate 92 for detecting the position of the movable member 32 reaches that point A, the resolver 93 is actuated and a position detection signal from the resolver 93 is inputted into the speed controlling section 91. The speed controlling section 91 discriminates that the front edge of the glass plate 10 has passed the point A and it moves the supporting means 11 by switching the moving speed to a speed of mode A (Steps c and d). By the mode A, the supporting means is moved under a distribution of speed (indicated by a solid line in FIG. 13b) which corresponds to a distribution of film thickness (indicated by a solid line in FIG. 13a) resulted when the glass plate 10 is moved in the film forming zone at a constant speed. When the glass plate has passed the film forming zone, the mode A is changed to the regular constant speed. Accordingly, when the mode A is executed by the speed controlling section 91, $SiO_2$ film can be uniformly deposited on the glass plate.

When the magnetic plate 92 for detecting the position of the movable member 32 reaches a point B, the resolver 94 is actuated and a position detection signal is inputted to the speed controlling section 91. The speed controlling section 91 discriminates that the front edge of the glass plate 10 has passed the point B on the basis of the signal from the resolver 94 and it changes the moving speed of the supporting means 11 to a speed of mode B (Steps e and f). By changing the speed to the mode B, the supporting means 11 is moved under a distribution of speed (indicated by a dotted line in FIG. 13b) which corresponds to a distribution of film thickness (indicated by a dotted line in FIG. 13a) resulted when the glass plate 10 is moved in the film forming zone at a constant speed. When the supporting means 11 has passed the film forming zone, the speed of mode B is changed to the regular constant speed. Accordingly, when the mode B is executed by the speed controlling section 91, the transparent conductive film of ITO is uniformly deposited on the $SiO_2$ film on the glass plate 10.

Figure 14A:
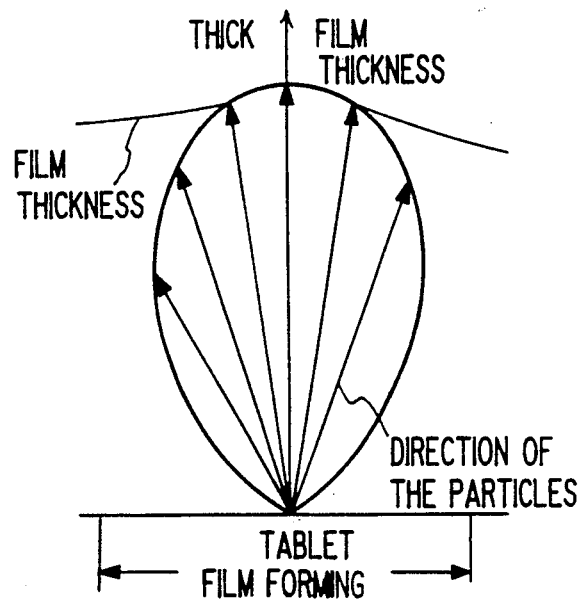
FIG. 14a is a diagram showing a distribution of film forming at the film forming zone at the time of fowarding the supporting means at a constant speed in a modified embodiment of the fifth embodiment where a vacuum vapor deposition apparatus is used for a vacuum processing means.
Figure 14B:
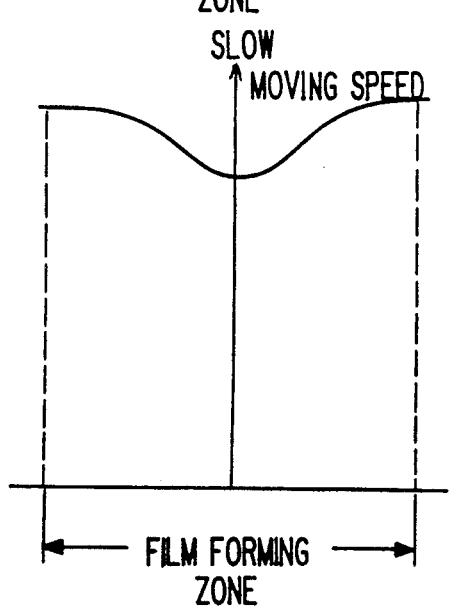
FIG. 14b is a diagram showing a distribution of speed for the supporting means at the film forming zone in the modified embodiment of the fifth embodiment.
Figure 15:
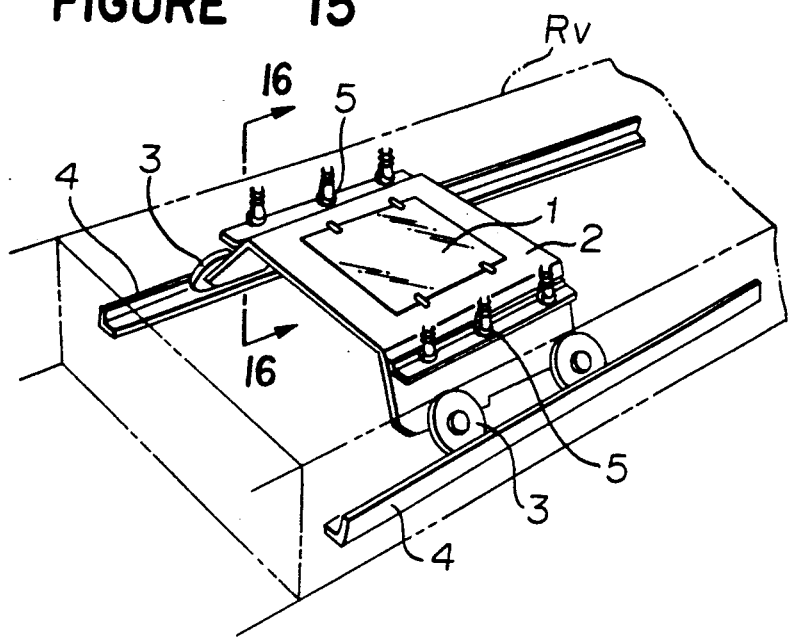
FIG. 15 is a perspective view of an important part of the transportation means in a conventional vacuum processing apparatus.
Figure 16:
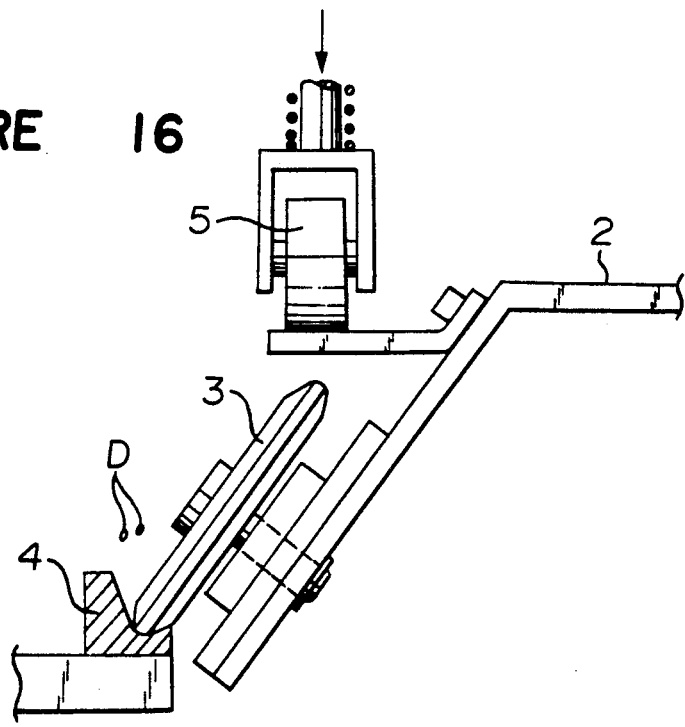
FIG. 16 is a cross sectional view taken along a line XVI—XVI in FIG. 15.

In the above-mentioned embodiments, description has been made as to the vapor deposition by sputtering. However, when a treatment of vacuum vapor deposition is carried out at the processing stage ST where particles to be deposited on the substrate is vaporized from a tablet, a uniformly vapor-deposited film can be formed by moving the supporting means under a distribution of speed (FIG. 14b) in consideration of a distribution of film thickness (FIG. 14a) resulted when the glass plate 10 is moved in the film forming zone at a constant speed.

In the fifth embodiment of the present invention, the speed controlling section 91 is used to form a uniformly vapor-deposited film by sputtering. However, the speed controlling section 91 can be used by changing its design even when the thickness of the film on the glass plate 10 at a specified portion is changed.

As described above, in accordance with the vacuum processing apparatus of the present invention, the following advantages can be provided.

Since the supporting means is moved by the vacuum transportation means composed of a pair of the transportation means, the substrate to be processed mounted on the supporting means can be moved in a stable manner and the position of the substrate at each of the processing stages can be correctly maintained, hence excellent processing can be provided.

Since at least one transportation means is constituted by the magnetically floating type linear motor transportation means and at least one supporting member on the supporting means is moved in a non-contacting state, a resistance of sliding in the transportation means can be eliminated or minimized, hence the production of dust from the contacting portion can be effectively eliminated. Accordingly, the adhesion of dust to a portion to be processed on the substrate can be effectively avoided, whereby faulty product due to the deposition of dust can be prevented.

The shielding members shield needless energy and materials from the processing means, adverse effect to the vacuum transportation means by the needless energy and material from the processing means can be avoided, whereby the vacuum processing apparatus can be effectively maintained.

In accordance with the vacuum processing apparatus of the present invention, the paired transportation means are both the magnetically floating type linear motor transportation means in which the driving force generating section is provided in only one transportation means. Accordingly, a resistance of sliding in the transportation means can be eliminated and the production of dust can completely be prevented. Further, the supporting means can be stably moved by eliminating uneven driving forces from the pair of transportation means.

In accordance with the vacuum processing apparatus of the present invention, since the position of the movable member in a rising state in the vertical and horizontal directions can be certainly controlled, the fluctuation of the movale member in the vertical and horizontal directions can be effectively prevented.

In accordance with the vacuum processing apparatus of the present invention, since the magnetically exciting parts for driving and for controlling rising position are provided at the side of the stationary member in the magnetically floating type linear motor transportation means, electric wiring operations to the movable member are unnecessary, so that other wiring operation can be easy and a cooling structure to heat from the magnetically exciting parts can be easily adopted.

In accordance with the vacuum processing apparatus of the present invention, since the auxiliary rollers are attached to the movable member in the magnetically floating type linear motor transportation means, the movable member can be easily moved even in a non-rising state, hence maintenance operations can be simple.

In accordance with the vacuum processing apparatus of the present invention, since a thermally deformed portion of the supporting means is absorbed by the gap created between the stationary member and the movable member; there is no possibility to impair the stable transportation of the supporting means when a heat treatment is conducted at the processing stages.

In accordance with the vacuum processing apparatus of the present invention, since a plurality of substrates can be processed by one single supporting means, the apparatus is effectively used for a large scale production.

In accordance with the vacuum processing apparatus of the present invention, since the speed of the supporting means is controlled depending on a distribution of processing speed in the processing means by the speed controlling section, uniform processing can be applied to the material to be processed by the processing means.

I claim:

1. A transportation system for a vacuum processing apparatus which comprises a supporting means for supporting a material to be processed and a transportation means for transporting said supporting means in a vacuum processing apparatus wherein said transportation means comprises a magnetically floating type linear motor transportation means comprising a stationary member and a movable member movable with respect to said stationary member in a non-contacting state, wherein said transportation means comprises a pair of magnetically floating type linear motor transportation means at least one of which has a driving force generating section, and said supporting means comprises at least two side surfaces, said supporting means comprising supporting members at each of said side surfaces to support said material to be processed.

2. The transportation system for a vacuum processing apparatus according to claim 1, wherein said magnetically floating type linear motor transportation means has a rising position controlling unit for controlling gaps between said stationary member and said movable member.

3. The transportation system for a vacuum processing apparatus according to claim 1, wherein said stationary member has magnetically exciting parts for driving and position-controlling said movable member.

4. The transportation system for a vacuum processing apparatus according to claim 1, wherein said movable member of the magnetically floating type linear motor transportation means has auxiliary rollers for assisting the movement of said movable member in a non-rising state.

5. The transportation system for a vacuum processing apparatus according to claim 1, wherein a gap for compensating for thermal deformation of said supporting means is located between said stationary member and said movable member.

6. A vacuum processing apparatus which comprises:

a supporting means for supporting a substrate to be processed;

a transportation means for transporting said supporting means, said transportation means comprising a magnetically floating type linear motor transportation means which comprises a stationary member and a movable member movable with respect to said stationary member in a non-contacting state;

a vacuum processing means for vacuum-processing said substrate being transported at a processing stage in said vacuum processing apparatus; and a shielding member for shielding said transportation means for said vacuum processing means at a position corresponding to said processing stage;

wherein said transportation means comprises a pair of magnetically floating type linear motor transportation means at least one of which has a driving force generating section.

7. The vacuum processing apparatus according to claim 6, wherein said vacuum processing apparatus comprises supporting-means-position detecting members for regulating the movement of said transportation means on the basis of information detected by said supporting-means-position detecting members.

8. The vacuum processing apparatus according to claim 6, wherein said supporting means has a horizontal base portion, and a gap for compensating for thermal deformation of said supporting means is located between said stationary member and said movable member.

9. The vacuum processing apparatus according to claim 6, wherein said magnetically floating type linear motor transportation means has a rising position controlling unit for controlling gaps between said stationary member and said movable member.

10. The vacuum processing apparatus according to claim 6, wherein said stationary member has magnetically exciting parts for driving and position-controlling said movable member.

11. The vacuum processing apparatus according to claim 6, wherein said movable member of the magnetically floating type linear motor transportation means has auxiliary rollers for assisting the movement of said movable member in a non-rising state.

12. The vacuum processing apparatus according to claim 6, wherein said supporting means comprises at least two side surfaces, said supporting means comprising supporting members at each of said side surfaces to support said substrate to be processed.

13. The vacuum processing apparatus according to claim 6, wherein said transportation means has a speed controlling member for transporting said supporting means in correspondence to a distribution of processing speed of said vacuum processing means at said processing stage.

14. The transportation system for a vacuum processing apparatus according to claim 6, wherein said stationary member comprises a plurality of members with a suitable length constituting unit pieces.

* * * * *